United States Patent
Droz

(10) Patent No.: US 8,733,662 B2
(45) Date of Patent: May 27, 2014

(54) METHOD OF MANUFACTURING CARDS THAT EACH INCLUDE AN ELECTRONIC MODULE AND INTERMEDIATE PRODUCTS

(75) Inventor: François Droz, Corcelles (CH)

(73) Assignee: NagraID S.A., La Chaux-de-Fonds (CH)

( * ) Notice: Subject to any disclaimer, the term of this patent is extended or adjusted under 35 U.S.C. 154(b) by 1023 days.

(21) Appl. No.: 12/305,618

(22) PCT Filed: Jun. 5, 2007

(86) PCT No.: PCT/EP2007/055520
§ 371 (c)(1),
(2), (4) Date: Oct. 5, 2009

(87) PCT Pub. No.: WO2007/147727
PCT Pub. Date: Dec. 27, 2007

(65) Prior Publication Data
US 2010/0012731 A1  Jan. 21, 2010

(30) Foreign Application Priority Data
Jun. 19, 2006  (EP) ..................................... 06012550

(51) Int. Cl.
*G06K 19/02* (2006.01)
(52) U.S. Cl.
USPC ......................................... 235/488; 235/487
(58) Field of Classification Search
USPC ......................................... 235/487, 492, 488
See application file for complete search history.

(56) References Cited

U.S. PATENT DOCUMENTS

| | | |
|---|---|---|
| 4,990,759 A | 2/1991 | Gloton et al. |
| 5,272,374 A | 12/1993 | Kodai et al. |
| 5,399,847 A | 3/1995 | Droz |
| 6,206,291 B1 | 3/2001 | Droz |
| 6,239,976 B1 | 5/2001 | Templeton et al. |
| 6,467,692 B1 | 10/2002 | Tarantino et al. |
| 6,843,422 B2 | 1/2005 | Jones et al. |

(Continued)

FOREIGN PATENT DOCUMENTS

| | | |
|---|---|---|
| EP | 0570784 A1 | 11/1993 |
| EP | 0789323 A2 | 8/1997 |

(Continued)

OTHER PUBLICATIONS

Haghiri, Yahya et al., "7.2 Kontaklose Chipkaret (Laminiertechnik)," Vom Plastik zur Chipkarte, 1999, pp. 181-192.
International Search Report issued in corresponding application No. PCT/EP2007/055520, completed Aug. 24, 2008 and mailed Sep. 5, 2007.

(Continued)

*Primary Examiner* — Daniel Hess
(74) *Attorney, Agent, or Firm* — Griffin & Szipl, P.C.

(57) ABSTRACT

A method of manufacturing a card including an electronic module by providing a frame or a plate having at least one aperture for receiving the electronic module. At least one part of the peripheral area of the aperture is deformed or crushed by localized application of pressure, so as to reduce locally the thickness of the frame or plate in the peripheral area. The electronic module is brought opposite the corresponding aperture so a zone of the electronic module is superposed on a part of the peripheral area, and a material connection is established between the part of the peripheral area and the corresponding zone of the electronic module for assembling the electronic module to the frame or plate before a resin is subsequently added to at least one side of the electronic module.

23 Claims, 8 Drawing Sheets

(56) References Cited

U.S. PATENT DOCUMENTS

| | | |
|---|---|---|
| 7,770,517 B2 | 8/2010 | Ohsawa |
| 2002/0129970 A1 | 9/2002 | Murohara |
| 2003/0226899 A1 | 12/2003 | Finkelstein |
| 2004/0041262 A1 | 3/2004 | Okamoto et al. |
| 2004/0256466 A1 | 12/2004 | Droz |
| 2004/0256469 A1 | 12/2004 | Faenza et al. |
| 2005/0019989 A1 | 1/2005 | Droz |
| 2007/0004100 A1* | 1/2007 | Maekawa et al. ............ 438/149 |

FOREIGN PATENT DOCUMENTS

| | | |
|---|---|---|
| WO | 03/056500 A | 7/2003 |
| WO | 03/090151 A | 10/2003 |
| WO | 2004/068395 A | 8/2004 |
| WO | 2004/074000 A | 9/2004 |
| WO | 2004/102469 | 9/2004 |

OTHER PUBLICATIONS

Finkenzeller, Klaus, "12 Herstellung von Transpondern and kontaklosen Chipkarten," RFID Handbuch, Sep. 26, 2002, pp. 341-351.

International Search Report issued in priority application PCT/EP2006/00963 completed on Feb. 2, 2007 and mailed Mar. 28, 2007.

Office Action issued in co-pending related U.S. Appl. No. 13/451,849 on Jul. 23, 2012.

Notice of Allowance issued in co-pending related U.S. Appl. No. 12/305,577 on May 10, 2013.

Office Action issued in co-pending related U.S. Appl. No. 12/526,382 on Feb. 1, 2013.

Final Office Action issued in co-pending related U.S. Appl. No. 12/305,577 on Oct. 24, 2012.

Fundamentals of Machining/Orthogonal Machining, Materials and Processes in Manufacturing 480-81 (9th ed.), 2003.

* cited by examiner

METHOD OF MANUFACTURING CARDS THAT EACH INCLUDE AN ELECTRONIC MODULE AND INTERMEDIATE PRODUCTS

This is a National Phase Application in the United States of International Patent Application No. PCT/EP2007/055320 filed Jun. 5, 2007, which claims priority on European Patent Application No. 06012550.7, filed Jun. 19, 2006. The entire disclosures of the above patent applications are hereby incorporated by reference.

FIELD OF THE INVENTION

The present invention concerns a method of manufacturing cards that each include an electronic module, in particular, an electronic module comprising an electronic display. Preferably, the card obtained via the method according to the invention is a bank card, in particular, conforming to the ISO standard. However, the present invention can also apply to electronic cards whose general profile is not rectangular, particularly circular cards. The present invention also concerns intermediate products obtained within the scope of the method according to the invention.

BACKGROUND OF THE INVENTION

Electronic cards or integrated circuit cards have considerably developed over the last few years. Initially, electronic cards were formed of a card body including a resistive contact module housed in a recess in the body of the card. Then, contactless cards were made, i.e. cards including a transponder formed of an electronic circuit connected to an antenna. As electronic cards have developed, it is sought to integrate other electronic elements for other functions into the cards. By way of example, cards including a switch that can be activated by the user and an electronic display have been disclosed. Such cards generally require relatively large batteries or powering means of the photovoltaic cell type. In order to integrate these various elements in a card, they are generally grouped together in the form of at least one electronic module, including a support, on the surface of which various electronic elements are arranged. FIG. 1 shows a schematic example of this type of module. Module 2 includes an integrated circuit 4, connected to an electronic display 6, a battery 8 and an activator 10, arranged on a support or substrate 12, forming a PCB interconnecting these various elements. In order to limit the thickness of these modules, the battery and/or the display can be arranged at the periphery of support 12 or in recesses therein.

It is not easy to integrate a relatively large electronic module, made up of various elements of variable shape and size, in a card. Further, integrating a digital display, which has to be precisely positioned in the manufactured card, causes an additional problem, which the present invention proposes to overcome.

EP Patent No. 0 570 784 discloses, in one implementation, a method of manufacturing cards including an electronic unit, in particular, a transponder, which is placed in a main aperture in a positioning frame. According to the implementation disclosed, the transponder and the positioning frame are embedded in a binding agent that can be added in liquid viscous form, particularly a resin. The positioning frame in EP Patent No. 0 570 784 is used only for delimiting an inner zone for the transponder, formed of an integrated circuit and a coil, inside the card. Thus, when pressure is applied to the various elements and the binding agent to form a card, the transponder is held in an inner zone, whereas it is possible for the binding agent, in a non-solid state, to flow to form a layer that passes through the manufactured card. Those skilled in the art can find, in this Patent document, a method for integrating a relatively large and complex-shaped electronic module in a compact, flat card. However, the electronic module placed in the main aperture in a positioning frame, as described in that document, will often be moved slightly when the card is being formed. Indeed, this document does not disclose how to maintain the transponder in a precise, determined position inside the aperture in the positioning frame. Those skilled in the art might certainly think of reducing the dimensions of the main aperture to make them approximately match the dimensions of the electronic module, in particular the external profile of the module. However, manufacturing tolerances must be taken into account, so that it is difficult to envisage too tight a fit. Moreover, depending upon the way in which the modules are manufactured, the positioning of the various elements on the support may also vary slightly. Thus, for example, digital display 6 is arranged on the surface of the PCB or at the periphery thereof in a position that may vary slightly. However, to obtain a high quality card, this digital display must be positioned precisely relative to the external contour of the manufactured card. This is particular important when a transparent aperture, which fits the dimensions of the digital display, is arranged above the aperture to allow the user of the card to read the display.

There is a further problem in addition to this problem of positioning the electronic module relative to the external contour of the card. This problem concerns introduction of the electronic module at the centre of the card manufacturing installation. It will be noted here that electronic cards are generally manufactured in batches, i.e. several cards are manufactured simultaneously in the form of a plate that includes a plurality of electronic modules. Then, each card is separated from the plate during a cutting step, as is described in EP Patent No. 0 570 784. Within the scope of the latter disclosure, the transponder remains free in relation to the positioning frame until the card is formed. This requires precautions in the handling of the various elements provided to form the card, to ensure that the transponders remain in the corresponding apertures of the positioning structure until the press is activated.

The present invention thus also proposes to answer this latter problem, identified within the scope of the present invention, so as to simplify the provision of electronic modules while ensuring that the electronic modules are kept in the apertures of a positioning structure and to facilitate assembly of the various elements and materials provided for manufacturing the cards.

SUMMARY OF THE INVENTION

The present invention concerns generally a method of manufacturing at least one card, each card including an electronic module. The method provides for the provision of a frame or a plate having at least one aperture arranged for receiving at least this electronic module. This method is characterized in that at least one part of the peripheral area of said at least one aperture is deformed or crushed by the application of pressure, localised at this at least one part of the peripheral area, on said frame or said plate, so as to reduce locally the thickness of said frame or said plate in said at least one part of the peripheral area, in that said electronic module is brought opposite said at least one aperture, such that at least one zone of the electronic module is superposed on said at least one part of the peripheral area, and in that a material connection (i.e. a solid or rigid connection) is established between said at least one zone of said peripheral area of said frame or said plate and said at least one zone of the electronic module, before a resin is added to at least one side of said electronic module in a subsequent step of the method.

It will be noted that the card obtained via the method according to the invention can have several independent or electrically connected electronic units, which may be in a single aperture in a frame or in several apertures of a plate during the manufacturing process. In particular, a first unit is a digital display; a second unit is an electronic circuit and a third unit is a battery. These units can be arranged on the same support and together form the same module. However, some elements can have their own support or form a distinct unit connected to the elements only by the electrical connection wires or lugs. The various elements or units of an electronic module can be bare, or separately coated embedded, or have a common coating.

It should be noted that the resin could be added in various forms and in various states. The term "resin" should be understood in a broad sense, including various known adhesives, PVC and Polyurethane resins or other resins available to those skilled in the art.

In a first main implementation, the method according to the invention is characterized in that said localised application of pressure is carried out using a tool or a press before said electronic module is brought opposite said at least one corresponding aperture, said at least one deformed or crushed part defining at least one step on which said at least one zone of the electronic module is then placed.

In a second main implementation, the method according to the invention is characterized in that said electronic module is brought opposite said at least one corresponding aperture prior to said localised application of pressure, said at least one zone of the electronic module being then pressed against said at least one part of said peripheral area so as to crush or deform said at least one part and thus cause said electronic module to move at least slightly more deeply into said at least one aperture.

The parts of said peripheral area of the frame or plate that will be deformed or crushed can be formed of various materials and have different structures. Conventional PVC or softer PVC, which will deform more easily under the application of said pressure, can be used. A compressible material can also be used, for example a slightly expanded synthetic or natural material, which will be crushed locally by applying said pressure.

In a particular variant, the electronic module or the set of electrically connected electronic modules, is located in several apertures separated by one or more bridges provided between the various elements or units of one module. The material connection between the plate and the module, respectively modules, can then be provided at this or these bridge(s).

As a result of the features of the invention, the electronic module of each card is held in a determined position in at least one aperture in the frame or plate, owing to the material connection generated between said at least one zone of the electronic module and said at least one part of the peripheral area of said at least one aperture.

By selecting materials that adhere to each other, either by applying pressure, with or without the addition of heat used to melt at least partially one material or the other, or by adding adhesive between said at least one zone and said at least one part, the electronic module is sufficiently anchored in the frame to ensure that the module is held in a determined position. It is thus possible easily to transport and move a plate forming a skeleton for several cards with the electronic modules housed in a plurality of apertures, which greatly facilitates the provision of these elements in the card manufacturing installation. Moreover, at least partially fixing the edge of the module to the peripheral area of the corresponding aperture also ensures that the electronic module is held in position in the frame aperture during the entire card manufacturing method according to the invention, in particular when a resin is added.

Although the method according to the invention can already be carried out with only one part of the peripheral area of the frame and one corresponding zone of the edge of the electronic module, in a preferred variant of the method according to the invention, the frame aperture has first dimensions and a first profile and the electronic module has second dimensions and a second profile, arranged such that at least two distinct zones of the edge of the electronic module are superposed on two corresponding parts of the peripheral area of the frame aperture, these two zones and these two parts being respectively connected to each other and ensuring that the electronic module is positioned precisely relative to the frame.

According to a preferred variant of the invention, the electronic module is substantially entirely located inside the frame aperture, the thickness of the frame being greater than or approximately equal to the maximum height of the electronic module. Preferably, the thickness of the frame will be approximately adjusted to the maximum height of the electronic module. Pressure is then applied to deform or crush said parts of the frame, so that the electronic module is approximately located between the top face and the bottom face of the frame, once the corresponding zones of the module have been assembled to these parts of the frame.

The assembly formed of a plate with one or several apertures and one or several electronic modules housed in said aperture(s) forms an intermediate product according to the invention for manufacturing cards. This unit is characterized in that each electronic module has at least one zone materially connected to at least one part of the peripheral area of a corresponding aperture in the plate, said at least one part of said peripheral area being deformed or crushed by pressure and forming, jointly with said at least one zone, a material connection between the electronic module and said plate. It will be noted that at least one zone of the module and one corresponding part of the plate can also have the additional function of electrical connection between the module and a printed circuit on the plate.

It will be noted that in this text, the use of the terms "frame" or "plate" is non-restrictive and not exclusive, unless the context clearly indicates so. The assembly protected is generally formed by a plate pierced with apertures and, in particular, by a frame. The term "frame" is used for the particular case where the plate has a single aperture which houses at least one electronic module. In other cases, where there are several apertures, the term "plate" is generally used. Thus, particularly for a frame having a single electronic module in one aperture, the plate forms a frame that may be of varying width. However, when reference is made to an electronic module in a corresponding aperture in a plate, this plate defines a positioning frame for the module.

According to a preferred implementation of the invention, any resin or binding agent forming a filling material is added to the remaining space in the apertures in the plate of the aforementioned assembly, so that a full and approximately flat structure is obtained. According to the invention, each electronic module is thus materially connected to the frame or plate prior to addition of the resin. The plate obtained according to this implementation can form an intermediate product or a finished card. Various films can be added on either side of this plate, particularly to form external layers of the card and/or printing films.

In a preferred variant, the contour of each card is achieved by a final cutting operation, such that the previously described plate pierced with apertures is cut and then at least partially forms the edge of the card in the median zone. In another variant, the final cutting operation is carried out inside the aperture such that the median part of the edge of the card is essentially formed by the resin or filling material. In particular, if the electronic module includes a support for the various elements, for example a PCB, the cutting operation can also cut the substrate in an area close to the edge thereof. In this case, the edge of the support partly defines the edge of the resulting card.

BRIEF DESCRIPTION OF THE DRAWINGS

Other advantages and particular features of the method according to the present invention, and intermediate products obtained in preferred implementations of the method, will appear more clearly upon reading the following description. The description is made with reference to the illustrative drawings, given by way of non-limiting example, in which:

FIG. 15 shows approximately in cross-section one area of this plate corresponding to one card; the plate forming, in particular, an intermediate product according to the invention;

DETAILED DESCRIPTION OF THE ILLUSTRATIVE EMBODIMENTS

Figure 1:
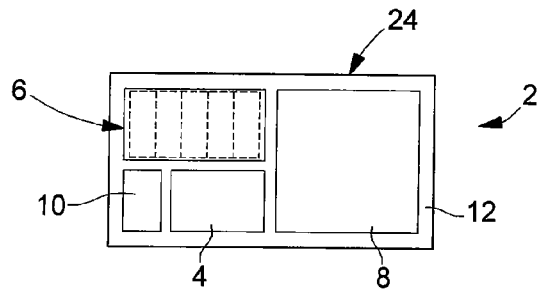
FIG. 1, already described, shows schematically an electronic module that can be integrated in a card according to the present invention.
Figure 2:
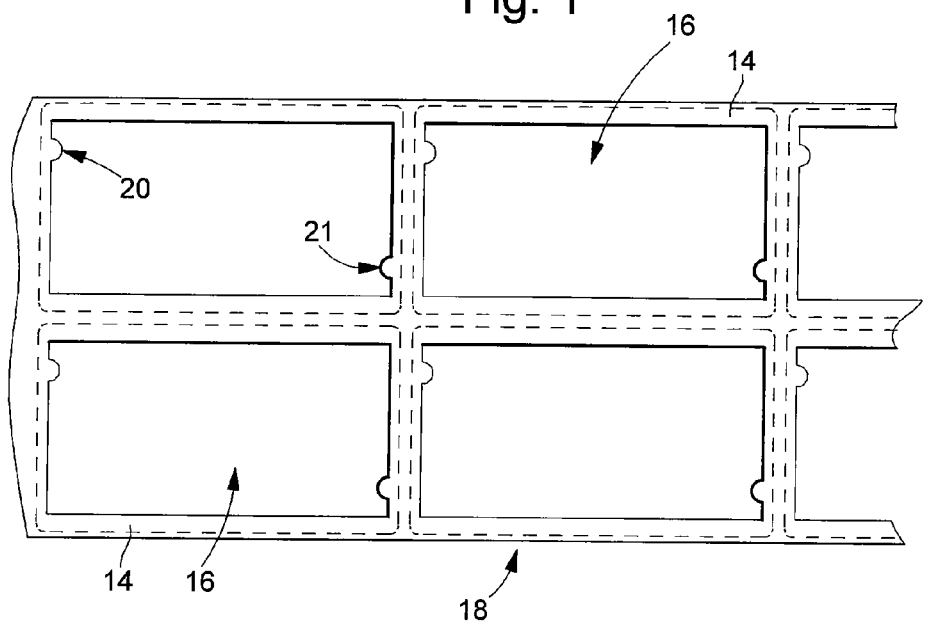
FIG. 2 shows a first embodiment of a plate forming a plurality of frames for the same number of cards manufactured in accordance with the present invention.

With reference to FIGS. 2 to 5, the initial steps of a first main implementation of the method according to the invention, will now be described. The manufactured cards include at least one electronic module 2, as shown schematically and solely by way of example in FIG. 1, and a frame 14, which has an aperture 16, arranged for receiving the electronic module. FIG. 2 shows a first embodiment of a plate 18 forming a plurality of frames for a corresponding plurality of cards manufactured in accordance with the invention. Plate 18 thus includes a plurality of through apertures 16 for receiving a corresponding plurality of electronic modules. The dotted lines define the external contours of the manufactured cards, which are cut along these dotted lines once the manufacturing method has been performed for a plurality of cards in the form of a plate.

It will be noted that in FIG. 2, the final cutting operation is performed such that one frame 14 remains in the card and thus forms the median part of the external edge of the card. In another variant, the final cutting operation could be performed inside the aperture such that the median part of the edge of the card is essentially formed by the filling material in the aperture.

Figure 3:
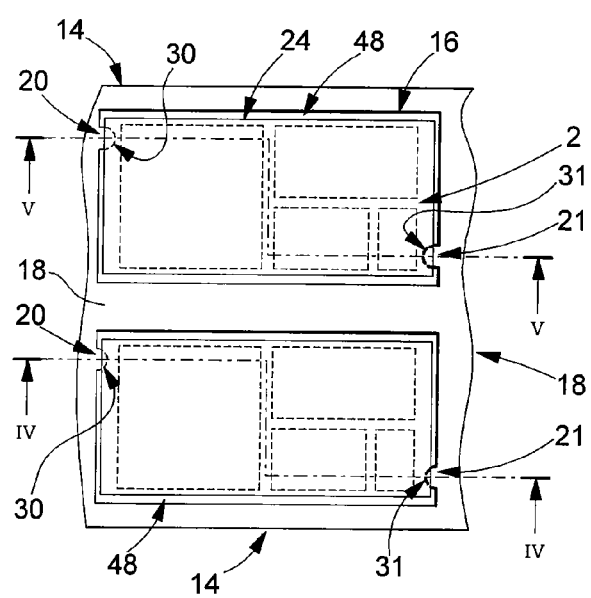
FIG. 3 shows partially the plate of FIG. 2, wherein two electronic modules are located in apertures of the plate, at two different stages of the method according to the invention.

As shown in FIG. 3, each through aperture 16 has first dimensions, in particular a first width and a first length, and a first profile, which is distinguished, by parts 20 and 21, which form two projecting portions relative to the generally rectangular profile of aperture 16. These two parts 20, 21 are located in the peripheral area of aperture 16. Electronic module 2 has second dimensions, namely a second width and a second length, and a second profile defined by the rectangular edge 24.

Figure 4:
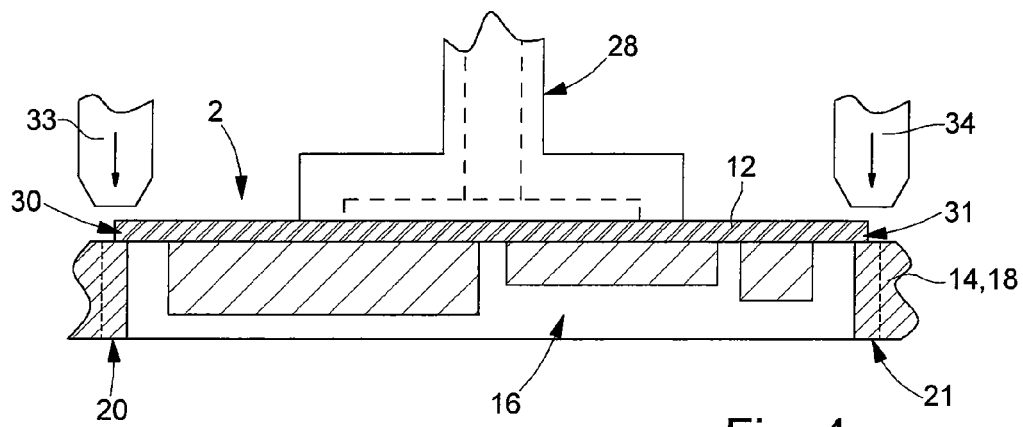
FIGS. 4 and 5 are cross-sections along the lines IV-IV and V-V of FIG. 3, showing respectively one step of a first main implementation of the method according to the invention and a first embodiment of a plate and electronic element assembly according to the invention.

As shown in FIG. 4, electronic module 2 is brought using picking or gripping means 28, fitted with suction means, which generate an air vacuum, opposite aperture 16 of frame 14. According to a first embodiment of the median plate and electronic module assembly described here, the first dimensions and the first profile of an aperture 16 are provided such that, compared to the second dimensions and second profile of an electronic module 2, at least two distinct zones 30 and 31 of the edge of this electronic module are superposed on the corresponding two parts 20 and 21 of the peripheral area of aperture 16. Zones 30 and 31 are applied against the respective parts 20 and 21 and are then pressed against each other in order to deform parts 20 and 21.

Plate 18 is formed, for example, of PVC or any other suitable material. In general, support 12 of electronic module 2 is formed by a PCB, which is deformed at a higher temperature than that at which the material forming plate 18 is deformed. However, in a particular embodiment, in particular so as to ensure some flexibility for an electronic module 2 of large dimensions, support 12 can also be formed of a material that has some suppleness or flexibility and that is deformed in a similar way to PVC.

Figure 5:
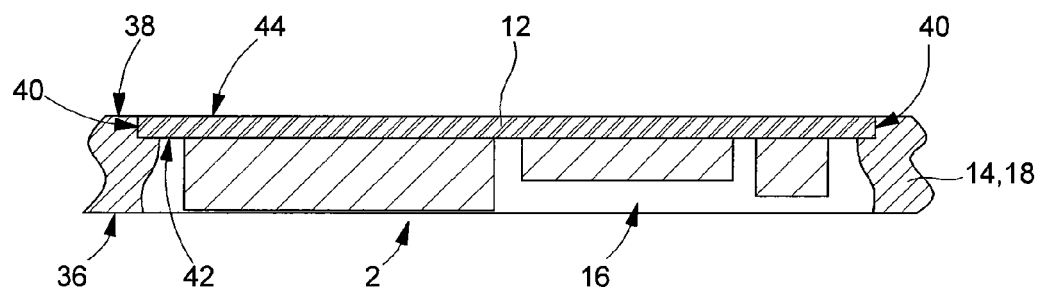

According to the variant of the method described with reference to FIG. 4, zones 30 and 31 are pressed against parts 20 and 21 using thermodes 33 and 34 for heating frame 14 locally in projecting parts 20 and 21 and causing the electronic module to move slightly deeper into aperture 16, until the module is substantially entirely inside aperture 16, as shown in FIG. 5. The thermo-compression performed using thermodes 33 and 34 thus enables support 12 to be introduced into aperture 16 so that module 2 is entirely located between the bottom surface 36 and the top surface 38 of plate 18. Deformation by thermo-compression thus anchors module 2 to frame 14.

Because of the pressure exerted on zones 30 and 31, these zones are pushed or penetrate into the corresponding projecting parts 20 and 21. An interface surface 40 is thus formed between support 12 and frame 14 in the areas of projecting portions 20 and 21. As is clear from FIG. 5, this step of deforming projecting portions 20 and 21, when zones 30 and 31 of module 2 penetrate these parts, enables the electronic module to be positioned precisely in aperture 16 in relation to frame 14. This positioning is firstly lateral and positions electronic display 6 precisely relative to frame 14. The positioning obtained is also vertical since the deformed parts 20 and 21 define stop members not only on the edge of support 12, but also against the bottom surface 42 of the support. The electronic module is thus positioned in aperture 16 of frame 14 by the two zones 30 and 31, which remain secured to parts 20 and 21, which are deformed so as to match the contour of the two zones. This ensures, in particular, that the electronic module does not leave its aperture during the handling of plate 18, which is shown in FIG. 2 and includes electronic modules 16 arranged in its apertures 15 as is shown in FIG. 5.

It will be noted that, according to a preferred implementation of the method of the invention, aperture 16 and electronic module 2 are arranged to allow a filling material to be introduced, particularly a resin, in the remaining space in the aperture, after the electronic module has been assembled to frame 14 or to a plate pierced with holes.

The implementation of the invention described here presents the preferred case with several distinct zones on the edge of module 2 superposed on several respective projecting parts, leaving a slot along most of the edge of the electronic module. However, an alternative implementation with a single zone on the module edge superposed on a single corresponding part of the peripheral area of aperture 16 can also be envisaged within the scope of the present invention. This variant already enjoys some of the advantages of the invention, in particular anchoring the electronic module in the frame.

The adherence of interface surface 40 can be increased, if necessary, by adding beforehand a thin film of adhesive over parts 20 and 21 or over the corresponding zones 30 and 31 on the side of the bottom surface 42 of support 12.

According to other embodiments of the pierced plate and electronic module assembly, parts 20 and 21 can be deformed without using heat. According to an advantageous variant, at least parts 20 and 21 of each frame 14 are formed of a material that can easily be plastically deformed. In a variant, deformation is facilitated by the use of ultrasound. In another variant, at least parts 20 and 21 are formed of a compressible material, which is crushed by said zones of the electronic module when pressure is applied.

Preferably, a picking or gripping tool 28 follows the movement of thermodes 33 and 34 until module 2 has entirely penetrated aperture 16, i.e. module 2 remains held by the tool during the step of deforming parts 20 and 21 by applying pressure. This guarantees very precise positioning of module 2 and also keeps it in a horizontal position, i.e. with support 12 approximately parallel to the top surface 38 of plate 18. This latter feature facilitates the integration of a module with electrical contacts, which is electrically connected to the electronic module.

As FIG. 5 shows, according to a preferred variant, the thickness of frame 14 is approximately identical to the maximum height of electronic module 2. This module is pushed into aperture 16 until the top surface 44 of support 12 approximately merges with the top face 38 of frame 14. As is particularly clear in FIG. 3, the first dimensions of aperture 16 and the second dimensions of electronic module 2 are such that a slot 48 remains between edge 24 of the module and the edge of the aperture, along most of the edge of the electronic module.

The electronic module is shown with a substrate onto one surface of which the various electronic elements are mounted. However, one could also have a module with paths or other electrical/electronic elements located on both surfaces of the substrate. In this latter case, it is advantageous to press the substrate against the projecting parts of the frame and to deform said parts until the substrate has sufficiently penetrated the aperture for the electronic module to be entirely inside the aperture.

Figure 6:
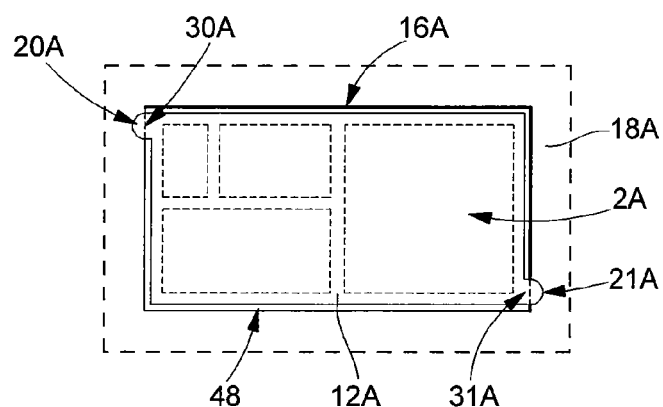
FIG. 6 shows schematically a second embodiment of the plate and electronic element assembly according to the invention.

FIG. 6 shows a second embodiment of the assembly of pierced plate 18A and electronic modules 2A. FIG. 6 shows a single aperture 16A in a plate forming a plurality of frames as shown in FIG. 2. The dimensions of a finished card are represented schematically by the outer dotted line. A similar diagram is used in the subsequent FIGS. 9, 10 and 11. Aperture 16A has a rectangular profile without any projecting portions. However, substrate 12A of module 2A has two zones 30A and 31A respectively forming two projecting parts relative to the general external profile of the module, i.e. relative to its rectangular profile. These two zones 30A and 31A on the edge of the electronic module are respectively superposed on two parts 20A and 21A in the peripheral area of aperture 16A. Electronic module 2A can be assembled to frame 14A in a similar manner to the manufacturing method according to the invention described above.

Figure 7:
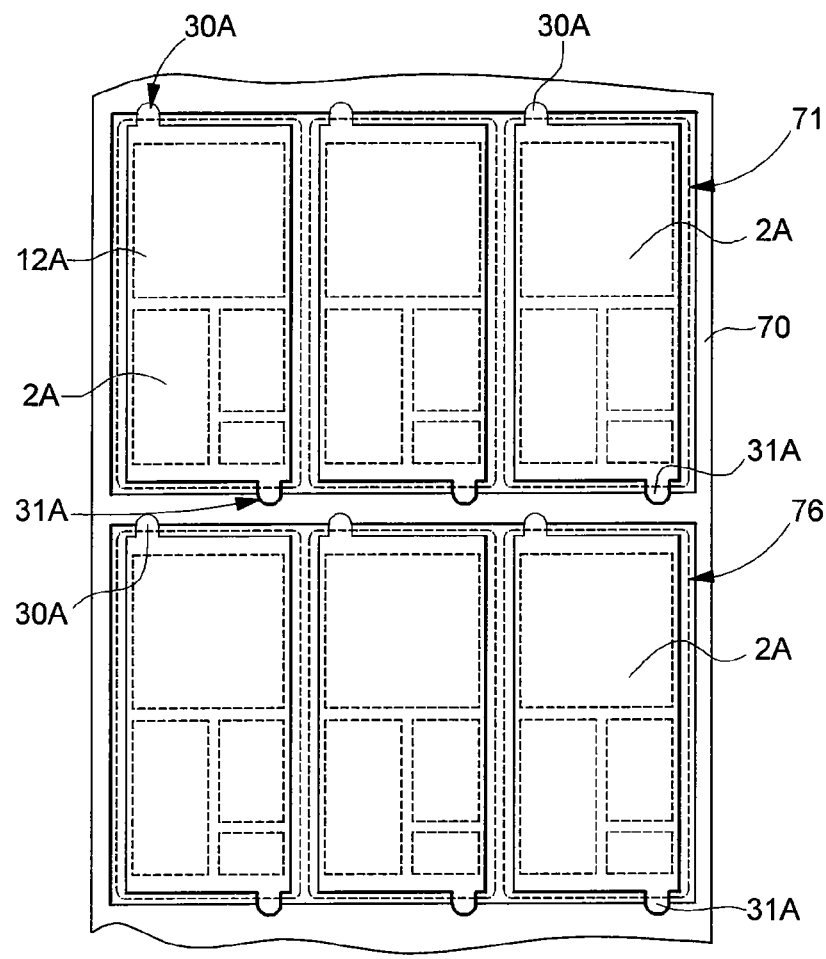
FIG. 7 shows an implementation of the method of the invention with the arrangement of several electronic modules in the same aperture in a plate.

FIG. 7 shows an alternative implementation of the method. This implementation is distinguished by the fact that several electronic modules 2A are arranged in the same aperture 71 of a plate 70. Zones 30A and 31A of support 12A are fixed to the peripheral area of aperture 71 as in the case of FIG. 6. The final cutting operation in aperture 71 completely removes plate 70. It will be noted that the cutting operation crops the two projecting portions 30A and 31A. A final cutting operation can also be provided for cutting the edge of the support 12A on at least part of its periphery.

Figure 8A:
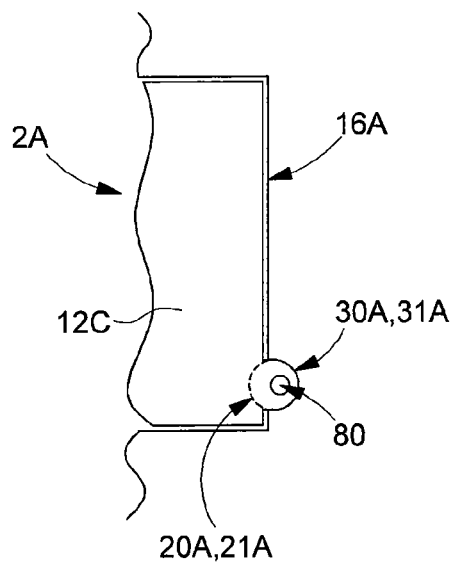
FIGS. 8A and 8B each show an embodiment detail of the material connection between an electronic module and the periphery of the aperture in a plate.
Figure 8B:
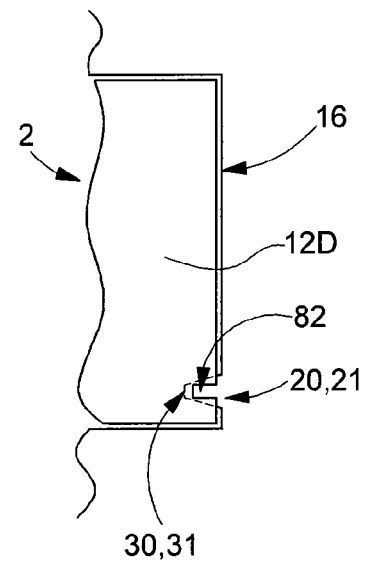

FIG. 8A shows a particular feature for better securing projecting zones 30A and 31A of support 12C of electronic module 2A to parts 20A and 21A of the peripheral area of aperture 16A. Each zone 30A and 31A is provided with a hole 80 which is partially penetrated by part 20A, respectively part 21A, when said part is deformed by pressure in accordance with the method of the invention described above. An alternative embodiment is shown in FIG. 8B for implementation in accordance with FIG. 3. Here, support 12D of electronic module 2 is provided with a slot 82 in zones 30 and 31 superposed on projecting parts 20 and 21 of the frame or plate. When these projecting parts are deformed by pressure in accordance with the aforementioned method, said parts partially penetrate slots 82 and secure module 2 properly to the frame or plate.

Figure 9A:
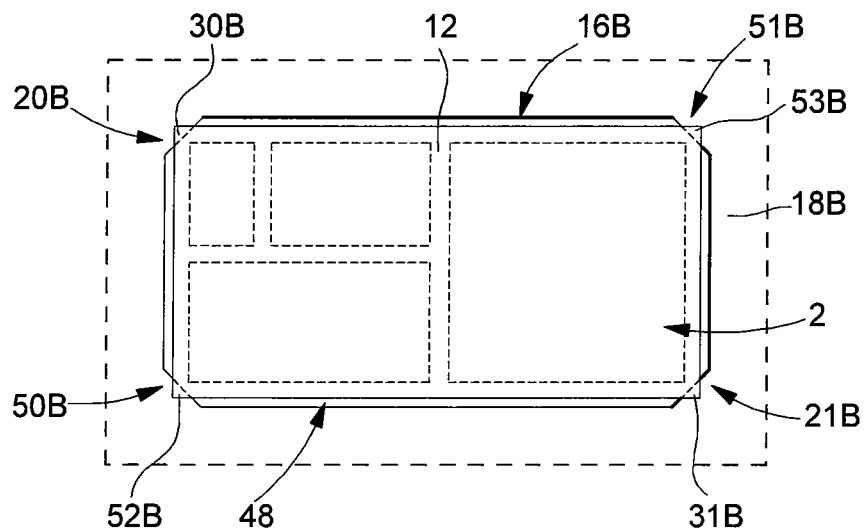
FIGS. 9A and 9B show two close variants of the first embodiment of the plate and electronic module assembly.
Figure 9B:
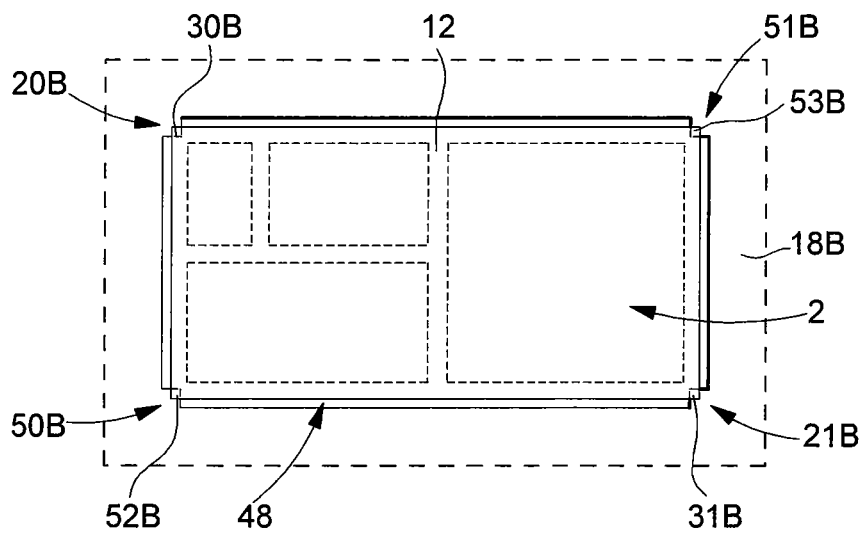

FIGS. 9A and 9B show two variants of the first embodiment of the pierced plate and electronic module assembly. Plate 18B has apertures 16B of generally rectangular shape, but with the four truncated corners defining four parts 20B, 21B, 50B and 51B of the peripheral area of an aperture. Support 12 of module 2 has a rectangular profile and dimensions such that the four corners 30B, 31B, 52B and 53B define four zones of module 2 respectively superposed on the four truncated corners of aperture 16B. Once module 2 has been brought opposite aperture 16B and correctly positioned relative to the frame, the four corners of support 12 are pressed against the four parts 20B, 21B, 50B and 51B of the plate to deform said parts in a similar manner to the method described above for assembling the electronic modules to the plate. The truncated corners are thus deformed and form stop members for support 12 along the two horizontal directions. of aperture 16B and also along the vertical direction. The truncated corner parts of aperture 16B are thus deformed so as to match the shape of the corners of the module and thereby enable module 2 to be precisely and stably positioned relative to plate 18B. A slot 48, relative to the lateral walls of aperture 16B, preferably remains along the four sides of module 2.

The variant of FIG. 9B differs from that of FIG. 9A only in that the parts of the peripheral area of the aperture superposed on the four corners of module 2 are formed by four projecting parts arranged in the four corners of aperture 16B. Each of these projecting parts defines a projection in the contour of aperture 16B.

Figure 10:
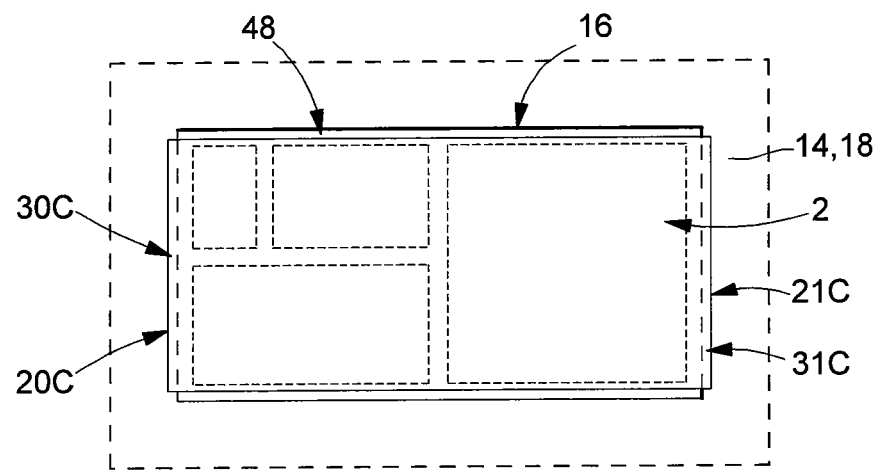
FIG. 10 shows a third embodiment of the plate and electronic module assembly for manufacturing a card according to the invention.

FIG. 10 concerns a third embodiment of the assembly of plate 18 and the electronic modules. Here, each aperture 16 and electronic module 2 both have a rectangular profile with no projecting parts. One dimension of support 12 is larger than the corresponding dimension of aperture 16. Thus, the two lateral zones 30C and 31C are defined by two opposite sides of the edge of module 2. These two zones are respectively superposed on the peripheral area of aperture 16 defining two edges 20C and 21C of rectangular aperture 16. Thus, as in the two other embodiments described above, the two zones 30C and 31C are pressed against parts 20C and 21C to allow module 2 to move slightly deeper into aperture 16 and to assemble module 2 to frame 14, respectively to plate 18, so that the module is arranged substantially entirely inside aperture 16, i.e. between the top and bottom surfaces of frame 14, as shown in FIG. 5. Parts 20C and 21C are preferably deformed by thermo-compression. However, as in the preceding embodiments, one could envisage obtaining the deformation at ambient temperature, depending upon the nature of the materials used, or by crushing a compressible material.

In a particular variant, the edge of support 12 covers the peripheral area of aperture 16 of frame 14 on the four sides of the aperture such that support 12 entirely closes aperture 16 on the support side. In such case, aperture 16 has to be a through aperture, so that a resin can be introduced into the remaining space in the aperture from the frame side opposite the side where support 12 is arranged.

It will be noted that the electronic modules partially fill the corresponding apertures in the embodiments shown in the Figures. Thus, the electronic modules are assembled to the pierced plate such that the air contained in the apertures can be easily evacuated from one side or other of the plate and also so as to allow a filling material to be introduced, in particular a resin, into these apertures, at least from one of the two sides of the plate. Preferably, the profile of each aperture and/or electronic module are arranged to leave passages or slots that pass through the assembly according to the invention. Thus, any residual air in the apertures when the resin is added can escape more easily and the resin can pass through the plate when it is introduced into the apertures. This is advantageous for several reasons. This prevents air pockets forming firstly when the electronic modules are assembled to the pierced plate and later when the resin is added to the remaining space in the apertures. This also prevents the resin being compressed in the apertures and causing inner stresses that could subsequently cause surface deformations in the finished card.

Figure 11:
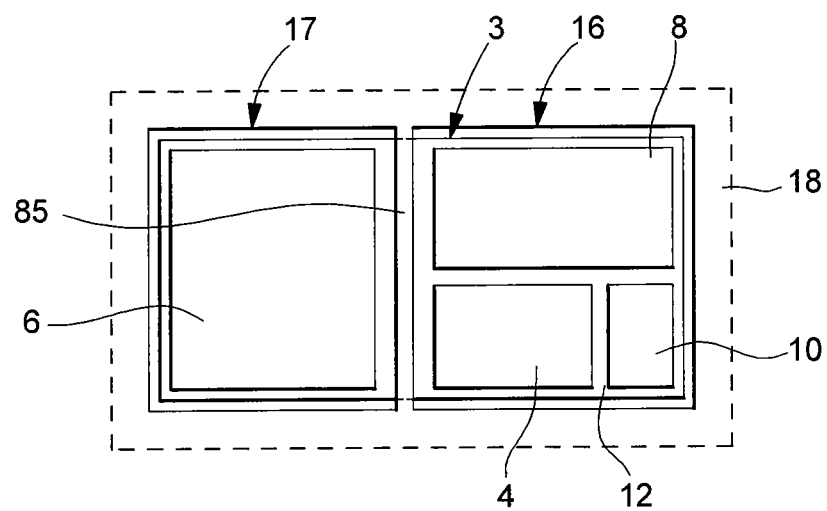
FIG. 11 shows schematically an alternative implementation of the method of the invention with an electronic module arranged in two apertures.

FIG. 11 shows a particular embodiment. The electronic module 3 includes the elements described in FIG. 1. Between display 6 and the other elements, support 12 has a free transverse zone. This zone is superposed on a bridge 85 of plate 18, and the bridge separates two apertures 16 and 17. Display 6 is introduced into aperture 17 whereas the other elements are located in aperture 16. According to the method of the invention, bridge 85 is pressed against the transverse zone of the support so as to deform the bridge to reduce the thickness thereof and to assemble module 3 to plate 18. According to the terminology used in the claims, it is clear that bridge 85 also forms a part of the peripheral area of each aperture 16, 17. The support is shown passing between the two apertures provided for receiving module 3. However, it is possible to make the support in two parts, respectively located in the two apertures. In this latter case, the material connection between module 3 and frame 18 can be obtained by pressing bridge 85 against the electrical connection wires or lugs provided between display 6 and the other part of module 3.

The assembly formed by a plate pierced with apertures and the electronic module or modules connected to the plate forms, in any given embodiment, an intermediate product according to the present invention.

Figure 12A:
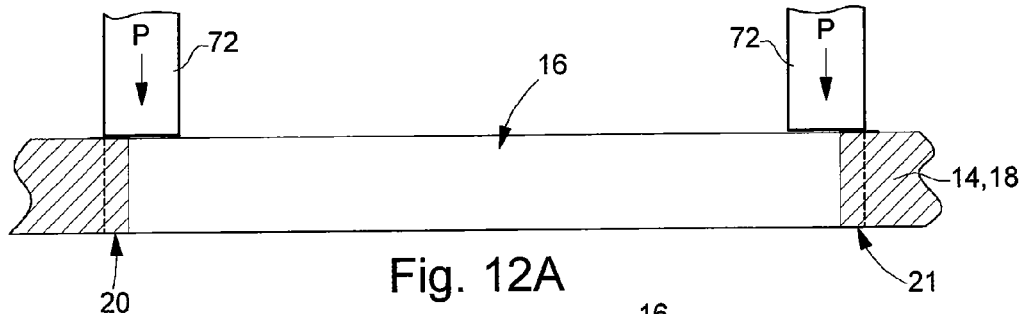
FIGS. 12A to 12C show a second main implementation of the method according to the invention.
Figure 12B:
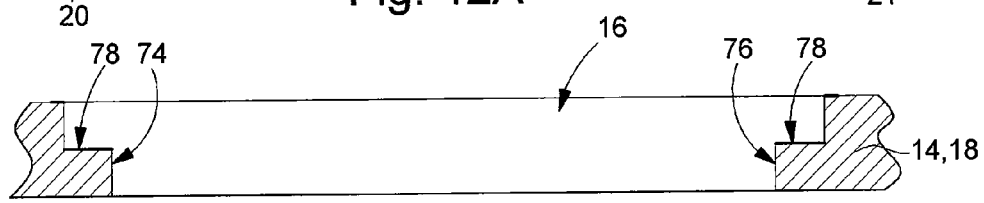
Figure 12C:
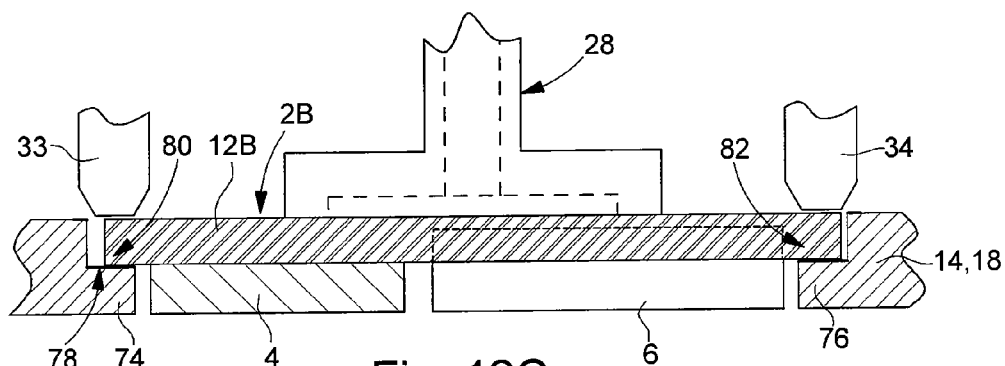
Figure 13:
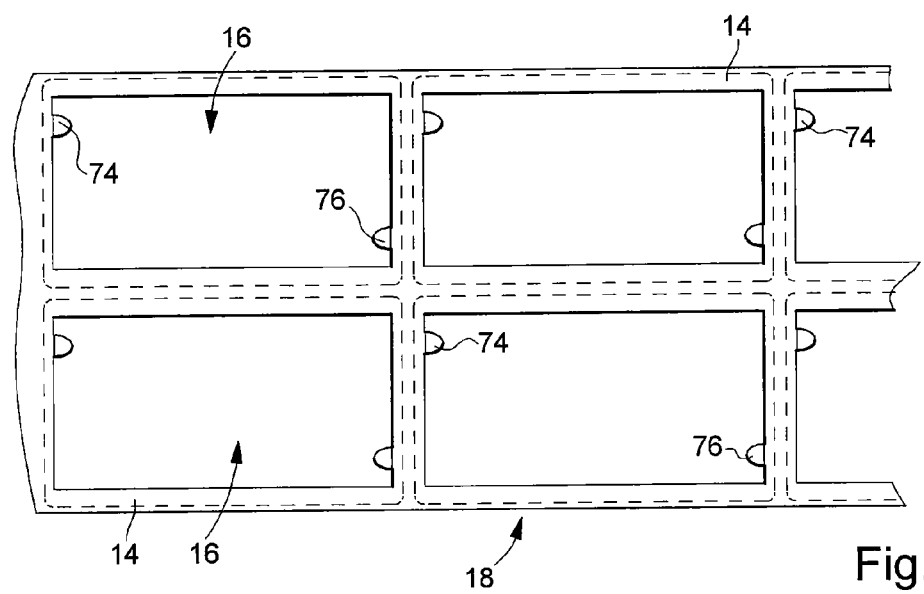
FIG. 13 shows an embodiment of a plate forming a plurality of frames for the same number of cards manufactured in accordance with the second main implementation, in a configuration corresponding to the cross-section of FIG. 12*b*.

With reference to FIGS. 12 to 14, a second main implementation of the method according to the invention will be described below. According to a first variant, described in FIGS. 12A to 12C, this second implementation is different essentially in that at least one part 20, 21 of the peripheral area of each aperture 16 of plate 18, forming a plurality of frames 14 for the same number of cards being manufactured, is deformed or crushed by applying pressure using a tool or a press 72. The pressure is preferably applied at approximately ambient temperature. At least one tongue 74, 76 is thus obtained, which defines a step that forms said at least one part of the peripheral area of aperture 16, In a preferred variant, a film of adhesive 78 is deposited before said application of pressure at least over projecting parts 20 and 21. The material for the adhesive is chosen so that it spreads when parts 20 and 21 are deformed.

Next, an electronic module 2B is brought into aperture 16 so that zones 80 and 82 of the edge of the module are superposed on the corresponding preformed tongues 74 and 76. Module 2B differs from the previously described module 2 in that its substrate 12B is thicker and a recess is provided in the substrate for arranging display 6. A similar arrangement can also be provided for the battery. Using a picking or gripping tool 28, module 2B is positioned in aperture 16. Thermodes 33 and 34 are provided for heating the adhesive film 78 slightly so as to ensure that zones 80 and 82 adhere well to tongues 74 and 76. However, it will be noted that other types of adhesive that do not require heat could be used. UV adhesives could be mentioned for example. As for the other embodiments described, previously, once assembled, plate 18 and modules 2B form a unit that defines an intermediate product according to the invention.

Figure 14A:
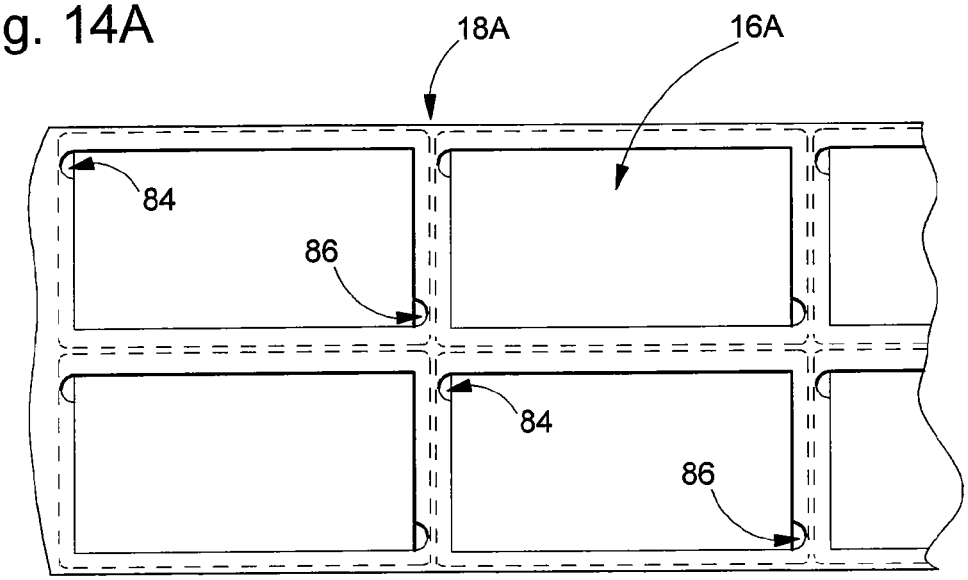
FIG. 14A shows another embodiment of a plate involved in the manufacture of cards according to the second main implementation of the invention, at the same stage as that shown in FIG. 13.
Figure 14B:
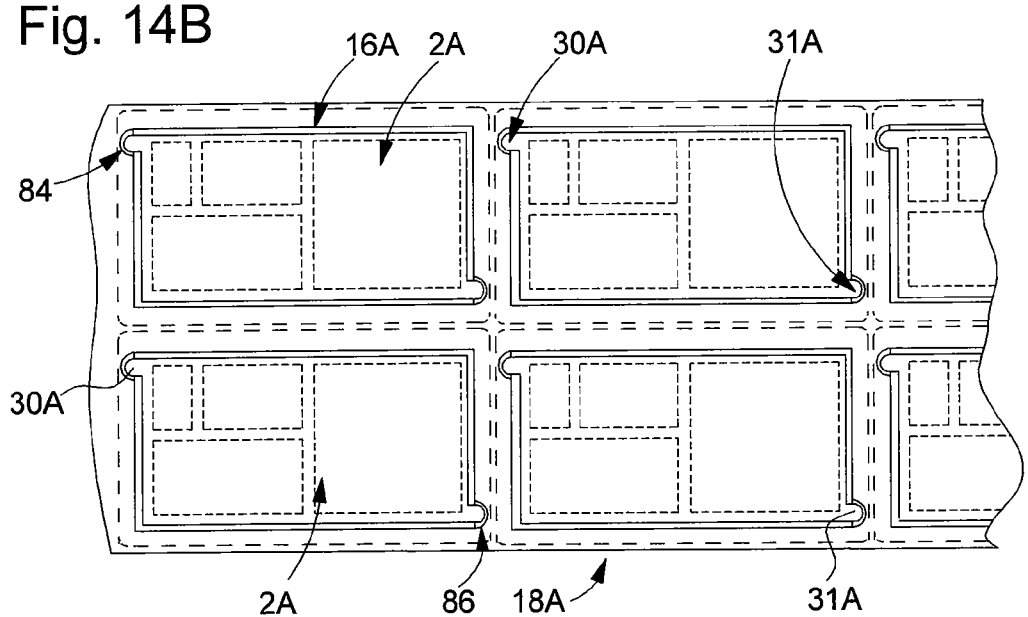
FIG. 14B shows an embodiment of the plate and electronic module assembly with the plate shown in FIG. 14A.

According to another variant of the second implementation shown in FIGS. 14A and 14B, plate 18A has parts 84 and 86 in the peripheral area of each aperture 16A, which are crushed or deformed by the application of pressure in similar manner to the first variant. Once deformed or crushed, parts 84 and 86, form notches at the periphery of apertures 16A. Once these notches have been pre-formed, modules 2A, with projecting zones or tongues 30A and 31A that were described in FIG. 6, are brought in a similar manner to the first variant in apertures 16A. Zones 30A and 31A are then placed in the corresponding notches 84 and 86. Again, an adhesive film can be provided at the surface of the notches or tongues 30A and 31A. The notches preferably have larger dimensions than the tongues of the module so as to allow the module to be positioned precisely when it is placed in the aperture. However, in another variant, the dimensions could be adjusted, so that the notches are used for properly positioning the module relative to frame 18A. When plate 18A and modules 2A are assembled to each other, they also form a unit that defines an intermediate product according to the invention.

Both tongues 74, 76 and notches 84, 86 define a step with a smaller thickness than that of the plate in which they are formed. All of the variants described within the scope of the first main implementation of the method according to the invention can apply by analogy to the second main implementation described above.

Figure 15:
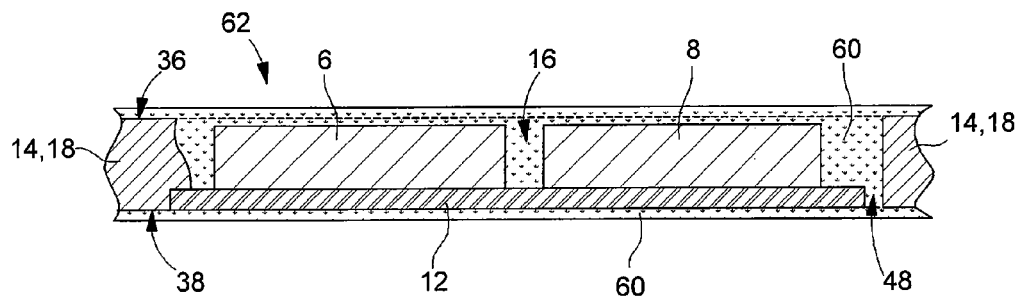
FIG. 15 is a partial cross-section of a plate manufactured in accordance with an implementation of the invention and forming several cards.

According to a preferred implementation of the method according to the invention, once the assembly of the plate and electronic modules has been formed, a resin 60 is added to fill at least the remaining space in the apertures. In the variant of FIG. 15, the added resin forms a layer whose thickness is greater than the height of the frame 14. The top and bottom surfaces 36 and 38 are thus coated with a thin resin film 60. This resin also fills slot 48 and thus forms an adherence interface between frame 14 and the edge of support 12. Since said electronic module includes an electronic display 6, resin 60 is transparent, at least in the area located above display 6.

Resin layer 60 can be formed by any technique known to those skilled in the art, in particular by injection moulding, using a press or at least a laminating roller. In general, this resin is added after a plurality of electronic modules have been arranged in a plurality of corresponding apertures in a plate defining a plurality of frames for batch manufactured cards.

Resin 60 can be formed by any appropriate material, particularly a polyurethane resin, an epoxy resin, hotmelt adhesive melted by adding heat, thermosetting materials, or even resin that hardens by ultraviolet exposure or in the presence of humidity. Resin means any filling material and any binding agent known to those skilled in the art and suitable for manufacturing cards.

Figure 16:
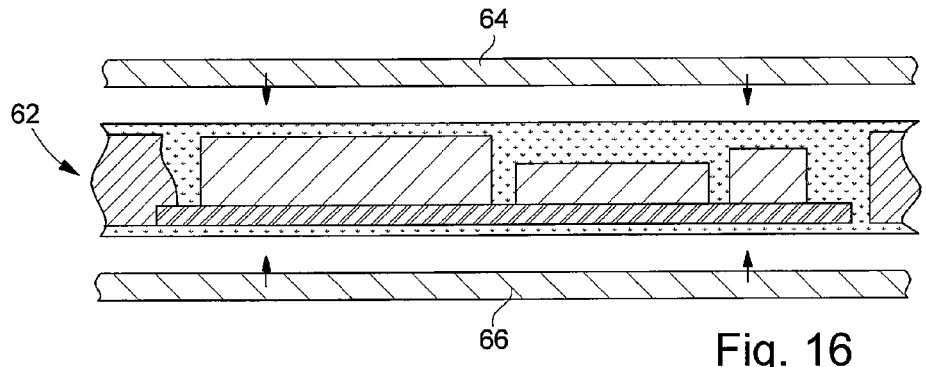
FIG. 16 shows a cross-section of an additional step of a variant of the first implementation of the method of the invention for obtaining finished cards from the intermediate product of FIG. 15.

The flat plate 62 obtained after the resin has solidified, as shown partially in FIG. 15, can form either a finished product, after the cards have been cut out of the plate, or an intermediate product with flat surfaces. It will be noted that the full plate 62, before the cards are cut out, forms an intermediate product that can be used subsequently in the manufacture of cards with external layers or films added on either side of plate 62, as shown in FIG. 16. It is also possible to cut plate 62 to obtain a plurality of intermediate products with approximately the dimensions of a card. In this latter case, the external layers are added card by card. FIG. 16 simply shows the addition of two solid layers 64 and 66 on each side of flat plate 62. These external layers 64 and 66 can be added and assembled to the intermediate product 62 by conventional lamination or bonding. Preferably, the cards are cut out of the plate obtained after the step shown in FIG. 16.

In another variant, the added resin approximately fills the volume remaining in aperture 16 without covering the top surface and the bottom surface of the frame or the plate. In this case, the resin can be added only to the side of the electronic module that is opposite the substrate. When flat layer 62 is formed, those skilled in the art can provide sheets that do not adhere, or barely adhere, on each side or on a single side of the product shown in FIG. 15, to prevent the resin from adhering to the press or rollers during the manufacturing process. These sheets can also protect the product during subsequent handling or transport to a plant for finishing the card. In the case of a finished product, these sheets guarantee protection of the surface prior to printing or sale. They are thus eventually removed.

Figure 17:
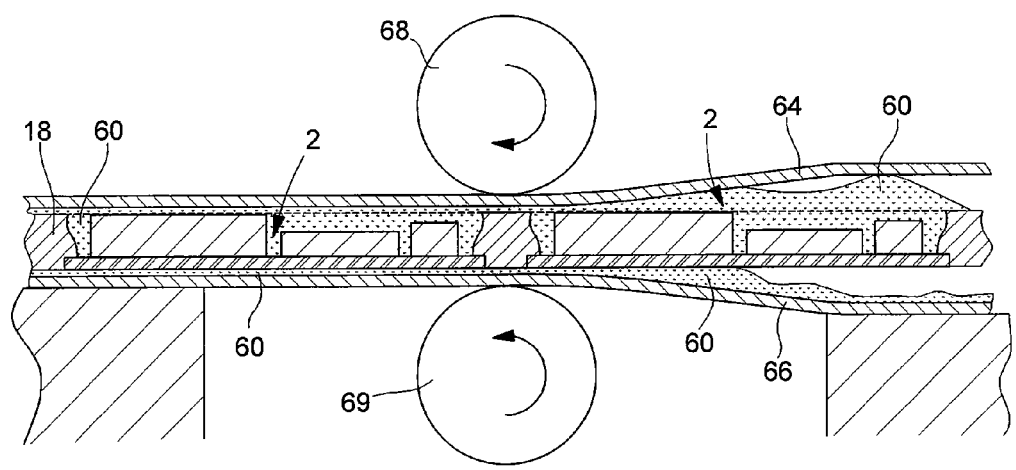
FIG. 17 shows schematically and in cross-section the formation of a plate defining several cards, manufactured in accordance with a preferred implementation of the method according to the invention.

Finally, FIG. 17 shows schematically an implementation according to the invention wherein a full, flat plate is formed, using laminating rollers 68 and 69, by pressing resin 60, which is still in a viscous state, and two external layers 64 and 66 to manufacture a full plate forming a plurality of cards. This full plate has a central layer, formed by a resin 60 comprising frame 14 and electronic modules 2, and two external layers on either side of the central layer. After the resin has solidified, the full plate can be cut into the bank card format. However, it will be noted that other films could also be added in a subsequent step.

It will be noted that resin 60 is preferably added in two steps. A first part is deposited on the bottom layer 66 and a second part is deposited on the assembly formed by plate 18 and electronic modules 2, as shown schematically in FIG. 17.

It will be noted that, when the resin is added, and in particular during the laminating step described schematically in FIG. 17, electronic modules 2 are perfectly positioned relative to the apertures in frame 18 and they are held in this position despite the pressure exerted by rollers 68 and 69. Other pressing means could evidently be envisaged by those skilled in the art. As mentioned above, in a variant, the external layers 64 and 66 could be work sheets that are subsequently removed. In such case, these external layers do not adhere to resin 60.

The invention claimed is:

1. A method of manufacturing at least one card including an electronic module, the method comprising the steps of:
   (a) providing a frame or a plate having at least one aperture for receiving the electronic module;
   (b) applying pressure to deform or crush at least one part of the frame or plate in a peripheral area of said at least one aperture, wherein the application of pressure is localised at said at least one part of this frame or plate, so that the thickness of said frame or said plate is reduced locally in said at least one part;
   (c) bringing the electronic module opposite said at least one aperture so that at least one zone of the electronic module is superposed on said at least one part of the frame of plate in the peripheral area;
   (d) assembling together said at least one part of said frame or said plate and said at least one zone of said electronic module; and
   (e) adding a resin at least on one side of said frame or plate so as to fill any space remaining in said at least one aperture, wherein the resin is added after the at least one part of said frame or said plate is assembled with the at least one zone of said electronic module.

2. The method according to claim 1, wherein said localised application of pressure is achieved using a press before said at least one electronic module is brought opposite said at least one aperture, said at least one deformed or crushed part defining at least one step on which said at least one zone of the electronic module is then placed.

3. The method according to claim 1, wherein said electronic module is brought opposite said at least one corresponding aperture before said localised application of pressure, said at least one zone of the electronic module then being pressed against said at least one part of said frame or plate so as to crush or deform said at least one part and thus make said electronic module move at least slightly deeper into said at least one aperture.

4. The manufacturing method according to claim 1, wherein said electronic module includes an electronic display element.

5. The method according to claim 4, wherein said resin covers said display element, this resin being transparent.

6. The method according to claim 1, wherein said localised application of pressure is carried out without adding localised heat to said at least one part of said frame or said plate.

7. The method according to claim 6, wherein said localised application of pressure is carried out approximately at ambient temperature.

8. The manufacturing method according to claim 1, wherein said deformation of said at least one part in the peripheral area of said at least one aperture is obtained by localised thermocompression.

9. The manufacturing method according to claim 1, wherein at least one said zone or one said part in the peripheral area of said at least one aperture is coated with adhesive, before said electronic module is assembled to said frame or said plate, to form an adherent film between said zone and the corresponding part.

10. The manufacturing method according to claim 1, wherein said electronic module is arranged in a single aperture, said aperture having first dimensions and a first profile and said electronic module having second dimensions and a second profile, wherein said first dimensions and said first profile of said aperture and said second dimensions and said second profile of said electronic module are such that at least two distinct zones of said edge of the electronic module are superposed on as many corresponding parts of said frame or plate in said peripheral area of the aperture, the localised application of pressure being carried out on said corresponding parts, each of the zones and the part that corresponds thereto forming a rigid connection between the electronic module and the frame or the plate after said two elements have been assembled.

11. The method according to claim 10, wherein said at least one part of said frame or plate is formed by a projecting part relative to the general profile of said at least one aperture.

12. The method according to claim 10, wherein said at least one part of the frame or plate is formed by a truncated corner of said aperture or by a projecting angular portion relative to the general profile of said aperture.

13. The method according to claim 10, wherein said at least one zone of the edge of said electronic module is formed by a projecting portion relative to the general external profile of said electronic module.

14. The method according to claim 10, wherein said first dimensions, said first profile, said second dimensions and said second profile are such that a slot remains between said electronic module and said aperture along most of said edge of said electronic module.

15. The method according to claim 10, wherein the thickness of said frame or said plate is approximately identical to the maximum height of said electronic module, said electronic module being arranged in said at least one aperture such that said module is more or less entirely located between a bottom flat and a top flat defined by said frame or said plate.

16. The method according to claim 15, wherein said resin is also added to the bottom surface and the top surface of said frame or said plate.

17. The method according to claim 16, wherein at least two solid layers are respectively added to the two sides of said open plate assembled to electronic modules and covered by said resin, which is in a viscous state, each card obtained after the resin has solidified thus having two external layers.

18. The method according to claim 10, wherein an intermediate product with a bottom surface and a top surface that are approximately flat is obtained.

19. The method according to claim 1, wherein the thickness of said frame or said plate is approximately identical to the maximum height of said electronic module, said electronic module being arranged in said at least one aperture such that said module is more or less entirely located between a bottom flat and a top flat defined by said frame or said plate.

20. The method according to claim 1, wherein said resin is also added to the bottom surface and the top surface of said frame or said plate.

21. The method according to claim 20, wherein an intermediate product with a bottom surface and a top surface that are approximately flat is obtained.

22. The method according to claim 20, wherein at least two solid layers are respectively added to the two sides of said open plate assembled to electronic modules and said resin, which is in a viscous state, each card obtained after the resin has solidified thus having two external layers.

23. The method according to claim 1, wherein said resin is selected to adhere to PVC material.

* * * * *